(12) United States Patent
Tanabe et al.

(10) Patent No.: US 7,830,366 B2
(45) Date of Patent: Nov. 9, 2010

(54) TOUCH PANEL

(75) Inventors: Koji Tanabe, Osaka (JP); Shoji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 773 days.

(21) Appl. No.: 11/790,742

(22) Filed: Apr. 27, 2007

(65) Prior Publication Data

US 2008/0170040 A1  Jul. 17, 2008

(30) Foreign Application Priority Data

Jun. 28, 2006  (JP) .............................. 2006-177626

(51) Int. Cl.
*G06F 3/041* (2006.01)

(52) U.S. Cl. ................ 345/173; 178/18.05; 200/512

(58) Field of Classification Search .......... 345/173–178, 345/104; 178/18.03, 18.05, 18.06, 18.07; 463/37–38; 200/512–517

See application file for complete search history.

(56) References Cited

U.S. PATENT DOCUMENTS 4,763,136 A * 8/1988 Isobe ......................... 347/208

| | | | |
|---|---|---|---|
| 6,690,362 B1 * | 2/2004 | Motoyama et al. | 345/173 |
| 6,974,917 B2 * | 12/2005 | Hattori et al. | 178/18.01 |
| 7,304,008 B2 | 12/2007 | Belykh et al. | |
| 7,439,466 B2 * | 10/2008 | Yamaue et al. | 200/512 |
| 2002/0192247 A1 * | 12/2002 | Theisen | 424/401 |
| 2004/0051699 A1 | 3/2004 | Tanabe et al. | |
| 2007/0251912 A1 | 11/2007 | Sixou et al. | |
| 2007/0257797 A1 * | 11/2007 | Rancien et al. | 340/572.1 |

FOREIGN PATENT DOCUMENTS

| | | |
|---|---|---|
| CN | 1465005 A | 12/2003 |
| CN | 1671816 A | 9/2005 |
| JP | 2003-58319 | 3/2003 |
| WO | 2005/064296 | 7/2005 |
| WO | WO 2005/100021 | * 10/2005 |

* cited by examiner

*Primary Examiner*—Lun-Yi Lao
(74) *Attorney, Agent, or Firm*—Wenderoth, Lind & Ponack, L.L.P.

(57) ABSTRACT

The touch panel of the present invention has a thermally color-changing portion in the vicinity of a connecting portion which is to be bonded by heat. It can be easily checked whether the heat press has been performed at a predetermined temperature when the wiring board is connected to the top and bottom substrates, based on the degree of coloring of the thermally color-changing portion. This allows the touch panel to be manufactured simply and to ensure reliable electrical contact and separation.

7 Claims, 5 Drawing Sheets

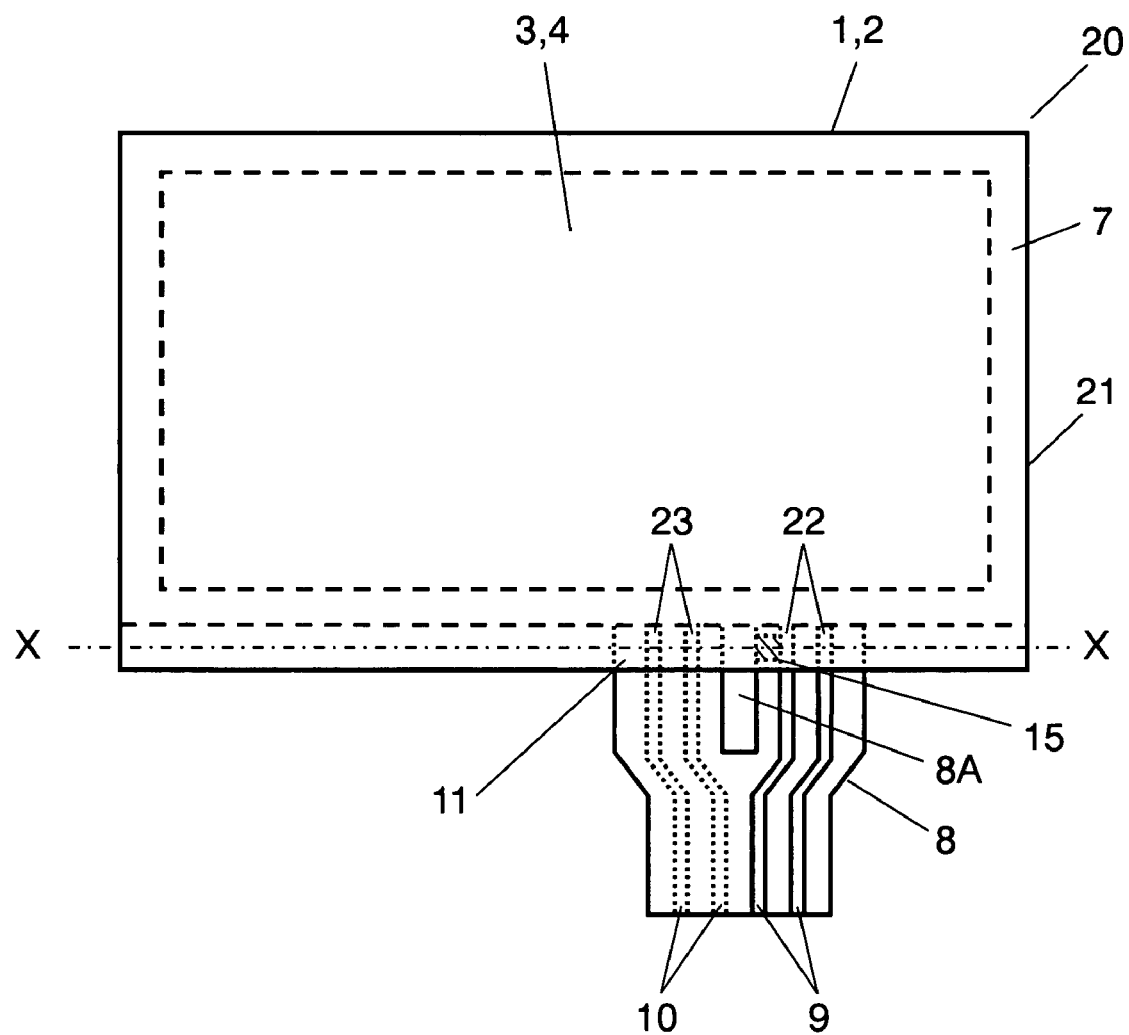

TOUCH PANEL

BACKGROUND OF THE INVENTION

1. Field of the Invention

The present invention relates to touch panels, which are mainly used to control various electronic devices.

2. Background Art

In recent years, various electronic devices such as mobile phones and car navigation systems are becoming increasingly functional and diverse. In line with this trend, more and more devices have alight transmissive touch panel attached to the front surface of a display element. Such a touch panel allows the user to select functions shown on the display behind the touch panel by pressing on the panel with a finger or a pen. Therefore, touch panels are required to provide excellent visibility and reliable operation.

A conventional touch panel is described with reference to FIGS. 4 and 5. These drawings are shown in an enlarged scale in the thickness direction in order to make the structure more understandable. FIG. 4 is a sectional view of an essential part of the conventional touch panel, and FIG. 5 is a plan view of the touch panel.

Conventional touch panel 40 includes top substrate 1 and bottom substrate 2, which is disposed under top substrate 1. Top substrate 1 is a light transmissive film, and bottom substrate 2 is also light transmissive. An upper conductive layer 3, which is made of a light transmissive material such as indium tin oxide, is provided on the bottom surface of the top substrate 1. A lower conductive layer 4, which is made of the same material as upper conductive layer 3, is provided on the top surface of the bottom substrate 2.

The top surface of lower conductive layer 4 has a plurality of dot spacers (unillustrated) made of an insulating resin and formed at predetermined intervals thereon. Upper conductive layer 3 has a pair of upper electrodes 5 at both ends thereof in the width direction (for example, in the right and left direction in FIG. 5). Lower conductive layer 4 has a pair of lower electrodes 6 which are at both ends thereof in the width direction and perpendicular to upper electrodes 5 (in the top and bottom direction in FIG. 5). Upper electrodes 5 and lower electrodes 6 are made of a conductive material such as silver.

The bottom surface of top substrate 1 or the top surface of bottom substrate 2 is provided at the periphery thereof with frame-like spacer 7. Spacer 7 has an adhesive layer (unillustrated) applied to the top and bottom sides thereof, so that the periphery of top substrate 1 and the periphery of bottom substrate 2 are bonded together with spacer 7. With top substrate 1 and bottom substrate 2 bonded to each other, upper conductive layer 3 and lower conductive layer 4 are opposed to each other with a predetermined gap therebetween. The end of upper electrodes 5 and the end of lower electrodes 6 are protruded from one end of top substrate 1 and bottom substrate 2.

Touch panel 40 further includes film-type wiring board 8 having slit 8A at one end thereof. Wiring board 8 has a plurality of upper wiring patterns 9 on one surface (the top surface in FIGS. 4 and 5) and a plurality of lower wiring patterns 10 on the other surface (the bottom surface in FIGS. 4 and 5). Upper wiring patterns 9 and lower wiring patterns 10 are exposed at both ends of wiring board 8 so as to be connected to other elements. The top and bottom surfaces of wiring board 8 excluding the end portions are provided with an insulating layer (unillustrated) to coat the upper and lower wiring patterns. One end of wiring board 8 is sandwiched between top substrate 1 and bottom substrate 2. Upper wiring patterns 9 and lower wiring patterns 10 are made of a conductive material such as silver.

The aforementioned end of wiring board 8 is fixedly bonded between top substrate 1 and bottom substrate 2 by using anisotropic conductive adhesive 11. Anisotropic conductive adhesive 11 includes synthetic resin 11A and conductive particles 11B dispersed in synthetic resin 11A. Touch panel 40 is constructed in this manner by electrically connecting the end of upper electrodes 5 to one end of upper wiring patterns 9 and also connecting the end of lower electrodes 6 to one end of lower wiring patterns 10 via conductive particles 11B.

Touch panel 40 thus structured is attached to the front surface of a liquid crystal display or the like of an electronic device. The other end of upper wiring patterns 9 of wiring board 8 and the other end of lower wiring patterns 10 are connected to an electronic circuit (unillustrated) of the device by a connector or soldering.

Conventional touch panel 40 operates as follows.

The user presses on the top surface of top substrate 1 with a finger, a pen, or the like while watching the display of the liquid crystal display behind touch panel 40. As a result, top substrate 1 is bent downward to bring the pressed portion of upper conductive layer 3 into contact with lower conductive layer 4.

At the same time, the unillustrated electronic circuit supplies a voltage sequentially to upper electrodes 5 and lower electrodes 6 via upper wiring patterns 9 and lower wiring patterns 10, respectively, of wiring board 8. When upper conductive layer 3 is brought into contact with lower conductive layer 4, the electronic circuit detects the point of contact from the voltage ratio between upper and lower electrodes. Thus, the electronic circuit can switch various functions corresponding to pressed points.

Touch panel 40 is manufactured as follows.

First of all, top substrate 1 and bottom substrate 2, which have nearly the same size, are bonded together by spacer 7 disposed therebetween. At this moment, one end of wiring board 8 is sandwiched between the portion of top substrate 1 where the end of upper electrodes 5 is protruded and the portion of bottom substrate 2 where the end of lower electrodes 6 is protruded. The positioning is performed in such a manner that upper wiring patterns 9 are overlapped with upper electrodes 5 and lower wiring patterns 10 are overlapped with lower electrodes 6.

Then, the sandwiched end of wiring board 8 is heat-pressed at a predetermined temperature from both the top surface of top substrate 1 and the bottom surface of bottom substrate 2 by using a tool or the like. The heat pressing hardens anisotropic conductive adhesive 11 applied to the bottom surface of top substrate 1, the top surface of bottom substrate 2, or the end of wiring board 8. Hardened anisotropic conductive adhesive 11 allows the end of upper electrodes 5 to be bonded and electrically connected to the end of upper wiring patterns 9, and the end of lower electrodes 6 to be bonded and electrically connected to the end of lower wiring patterns 10. Touch panel 40 connected to wiring board 8 is manufactured in this manner.

The bond and connection between wiring board 8 and top and bottom substrates 1 and 2 by using anisotropic conductive adhesive 11 is needed to be performed while maintaining the predetermined temperature. When the heat press is performed at a temperature lower than the predetermined temperature, anisotropic conductive adhesive 11 applied between wiring board 8 and top substrate 1 or bottom substrate 2 is insufficiently hardened. The insufficient hardening makes the bond strength of wiring board 8 low, thereby causing unstable electrical connection between upper electrodes 5 and upper wiring patterns 9 and between lower electrodes 6 and lower wiring patterns 10.

Therefore, it is necessary to check the heating temperature before and after the connection process by the heat press. It is also necessary after the connection process to check the connection condition of wiring board 8 by examining the resistance value between the upper/lower electrodes and the upper/lower wiring patterns or the adhesion condition using a microscope or the like. One such conventional art is disclosed in Japanese Patent Unexamined Publication No. 2003-58319.

In this conventional touch panel, however, it takes time to check the heating temperature and the adhesion condition when wiring board 8 is bonded and connected to the top and bottom substrates. Furthermore, if there is a variation in the resistance value or the adhesion condition, it is difficult and takes time to determine whether the resistance value and the adhesion condition are sufficient or not.

SUMMARY OF THE INVENTION

The touch panel of the present invention has a thermally color-changing portion in the vicinity of a connecting portion which is to be bonded by heat. It can be easily checked whether the heat press has been performed at a predetermined temperature when the wiring board is connected to the top and bottom substrates, based on the degree of coloring of the thermally color-changing portion. This allows the touch panel to be manufactured simply and to ensure reliable electrical contact and separation.

Additional objects and advantages of the present invention will be apparent from the following detailed description of preferred embodiments thereof, which are best understood with reference to the accompanying drawings.

BRIEF DESCRIPTION OF THE DRAWINGS

FIG. 2A is a plan view of the touch panel according to the embodiment of the present invention.

DETAILED DESCRIPTION OF THE INVENTION

Figure 1:
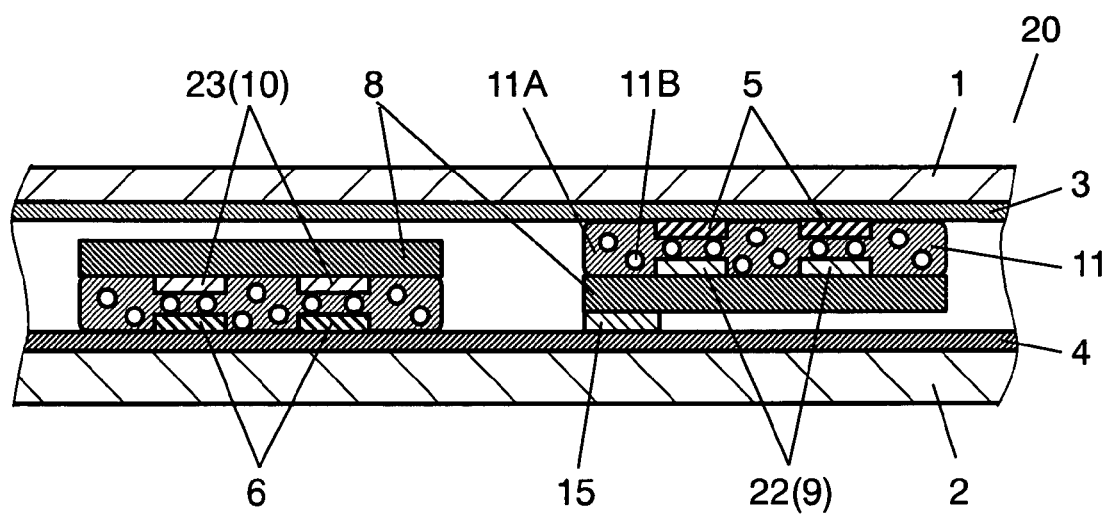
FIG. 1 is a sectional view of an essential part of a touch panel according to an embodiment of the present invention.
Figure 2B:
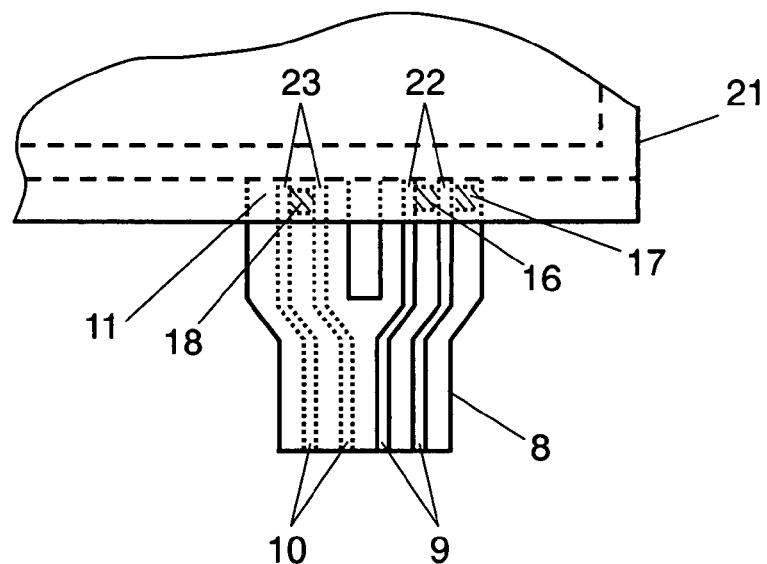
FIG. 2B is a plan view of the vicinity of connecting portions of the touch panel according to the embodiment of the present invention.
Figure 2C:
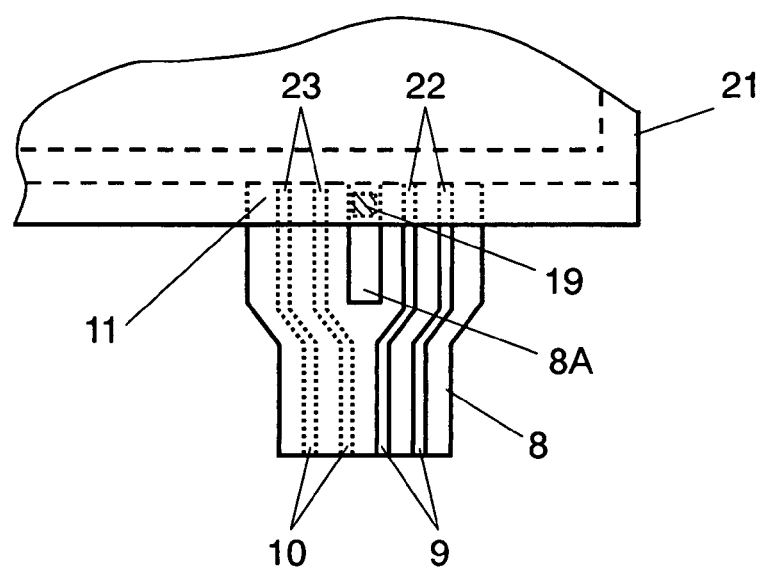
FIG. 2C is a plan view of the vicinity of connecting portions of a touch panel according to another embodiment of the present invention.
Figure 3:
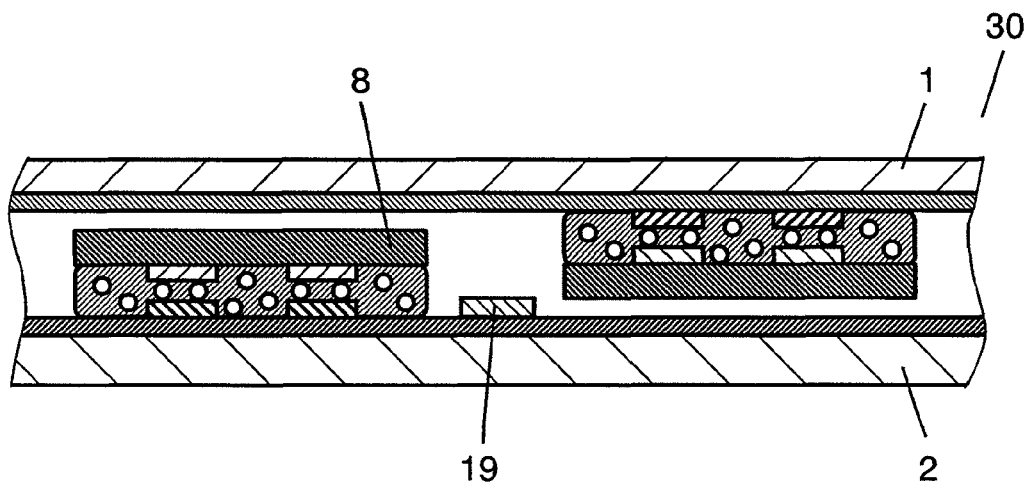
FIG. 3 is a sectional view of an essential part of the touch panel according to the embodiment of the present invention.
Figure 4:
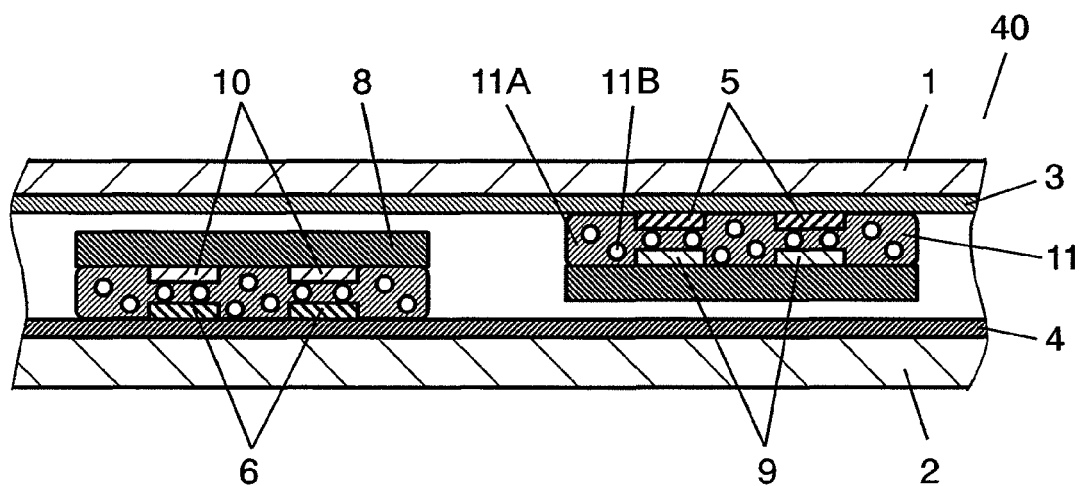
FIG. 4 is a sectional view of an essential part of a conventional touch panel.
Figure 5:
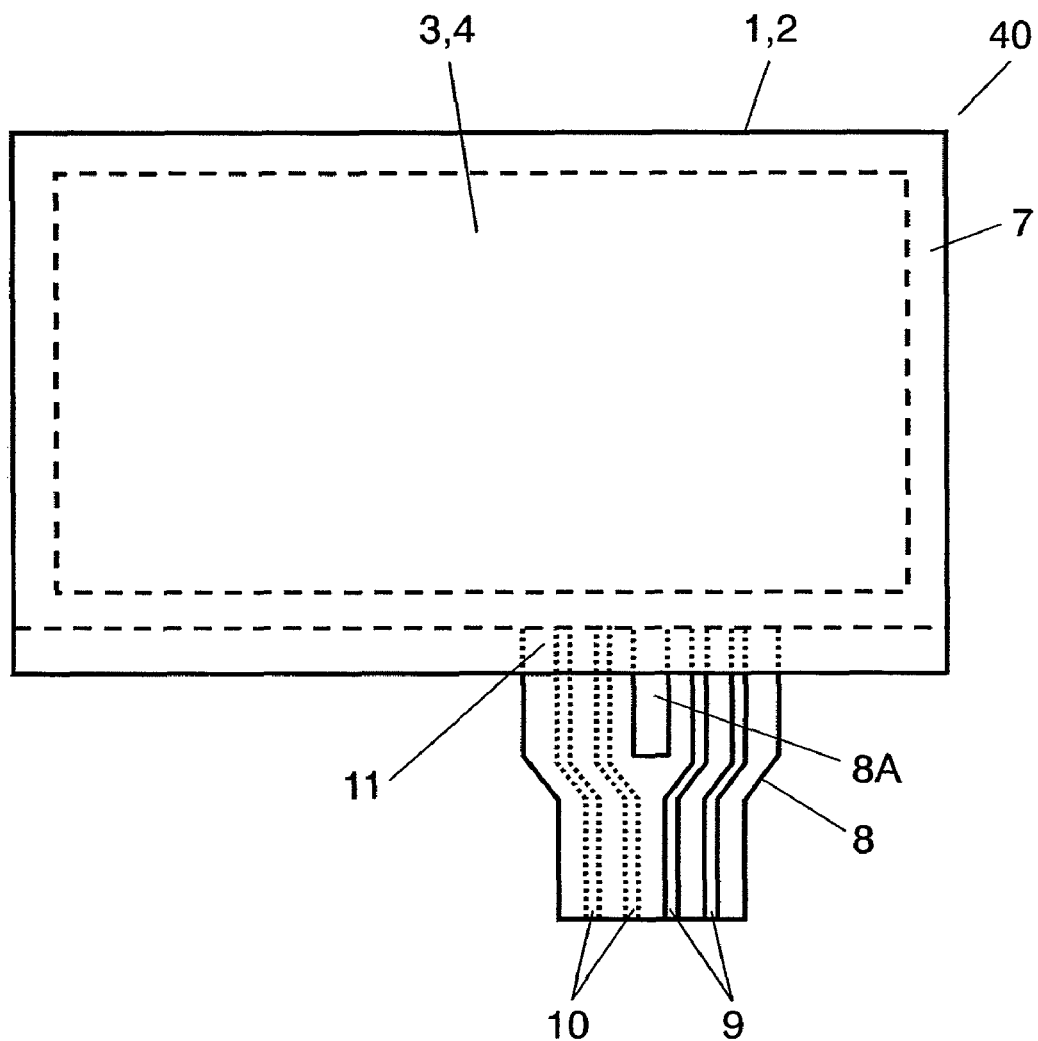
FIG. 5 is a plan view of the conventional touch panel.

Embodiments of the present invention are described as follow with reference to FIGS. 1 to 3. Some of the drawings are shown in an enlarged scale in the thickness direction in order to make the structure more understandable. The same components as those described in the "Background Art" will be referred to with the same numerals and symbols as those in the "Background Art" and not described in detail again.

Embodiment

FIGS. 1 and 2A show a touch panel according to an embodiment of the present invention. FIG. 1 is a sectional view taken along line X-X of FIG. 2A.

Touch panel 20 of the present embodiment includes panel portion 21 and wiring board 8. Panel portion 21 includes top substrate 1 and bottom substrate 2. Top substrate 1 is a film and made of a light transmissive material such as polyethylene terephthalate or polycarbonate. Bottom substrate 2 is made of a light transmissive material such as glass, acrylic, or polycarbonate. An upper conductive layer 3, which is made of a light transmissive material such as indium tin oxide or tin oxide, is provided on the bottom surface of the top substrate 1. A lower conductive layer 4 made of the same material as upper conductive layer 3 is provided on the top surface of the bottom substrate 2. Upper and lower conductive layers 3 and 4 can be formed by a thin-film forming method such as sputtering or vacuum deposition.

The top surface of lower conductive layer 4 has a plurality of dot spacers (unillustrated) formed at predetermined intervals thereon. The dot spacers are made of an insulating resin such as epoxy resin or silicon resin. Upper conductive layer 3 has a pair of upper electrodes 5 at both ends thereof on top substrate 1 (for example, in the right and left direction in FIG. 2A). Lower conductive layer 4 has a pair of lower electrodes 6 which are at both ends thereof on bottom substrate 2 and perpendicular to upper electrodes 5 (in the top and bottom direction in FIG. 2A). Upper electrodes 5 and lower electrodes 6 are made of silver, carbon, or the like.

The bottom surface of top substrate 1 or the top surface of bottom substrate 2 is provided at the periphery thereof with frame-like spacer 7 made of epoxy resin or polyester resin. Spacer 7 has an adhesive layer of acrylic resin or rubber (unillustrated) applied to the top and bottom sides thereof. When the periphery of top substrate 1 and the periphery of bottom substrate 2 are bonded together with spacer 7, upper conductive layer 3 and lower conductive layer 4 are opposed to each other with a predetermined gap therebetween. The end of upper electrodes 5 and the end of lower electrodes 6 are protruded from one end of top substrate 1 and bottom substrate 2.

Wiring board 8 connected to panel portion 21 has a plurality of upper wiring patterns 9 on the top surface thereof and a plurality of lower wiring patterns 10 on the bottom surface thereof. Upper wiring patterns 9 and lower wiring patterns 10 are exposed at both ends of wiring board 8 so as to be connected to other elements. The top and bottom surfaces of wiring board 8 excluding the end portions are provided with an insulating layer (unillustrated) to coat upper and lower wiring patterns 9 and 10. One end of wiring board 8 having slit 8A is sandwiched between top substrate 1 and bottom substrate 2. Wiring board 8 is a film made of polyethylene terephthalate or polycarbonate. Upper wiring patterns 9 and lower wiring patterns 10 are made of a conductive material such as silver, carbon, or copper. Wiring board 8 is divided into an upper and lower part with slit 8A therebetween. Upper wiring patterns 9 are connected to upper electrodes 5, and lower wiring patterns 10 are connected to lower electrodes 6. Upper electrodes 5 are routed around the periphery of top substrate 1, and lower electrodes 6 are routed around the periphery of bottom substrate 2. The portions of upper electrodes 5 that face wiring board 8 correspond to extraction electrodes to be connected to upper wiring patterns 9. Similarly, the portions of lower electrodes that face wiring board 8 correspond to extraction electrodes to be connected to lower wiring patterns 10. The route of upper and lower electrodes 5 and 6 and the shape of the extraction electrodes can be like those shown in the aforementioned Japanese Patent Unexamined Publication No. 2003-58319.

Next, one end of wiring board 8 is divided between top substrate 1 and bottom substrate 2 and fixed thereto with anisotropic conductive adhesive 11. Upper electrodes 5 and upper wiring patterns 9 are electrically connected at connecting portions 22, and lower electrodes 6 and lower wiring patterns 10 are electrically connected at connecting portions 23 by conductive particles 11B.

Anisotropic conductive adhesive 11 is formed by dispersing conductive particles 11B into synthetic resin 11A such as epoxy, acrylic, or polyester. Conductive particles 11B are made of nickel or resin having a particle diameter of about 2 to 15 µm and plated with gold.

Touch panel 20 of the present embodiment includes thermally color-changing portion 15 in the center of the bottom surface of wiring board 8. Thermally color-changing portion 15 changes in color when heated above a predetermined temperature.

Thermally color-changing portion 15 is made of a composition formed by adding a compound exhibiting a predetermined color to, for example, stearic acid having a melting point of 71° C., acetylsalicylic acid having a melting point of 135° C., or acetyl acid having a melting point of 159° C. The composition is dissolved in alcohol such as ethanol to form a solution, and the solution is applied to the bottom surface of wiring board 8 so as to form thermally color-changing portion 15. One possible method of changing the color of the thermally color-changing portion is to alter the molecular structure of the compound in the composition by heat. The compound can be a dye containing a specific metal complex or a specific halogen compound. Another possible method of changing the color is to heat a thermoplastic resin that coats a pigment, thereby exposing the pigment.

Touch panel 20 is manufactured as follows.

First of all, top substrate 1 and bottom substrate 2, which have nearly the same size, are bonded together by spacer 7 disposed therebetween. At this moment, one end of wiring board 8 is sandwiched between the extraction electrodes of top substrate 1 and the extraction electrodes of bottom substrate 2. The positioning is performed in such a manner that upper wiring patterns 9 are overlapped with upper electrodes 5, and lower wiring patterns 10 are overlapped with lower electrodes 6.

Then, the sandwiched end of wiring board 8 is heat-pressed at a predetermined temperature for 10 to 15 seconds from both the top surface of top substrate 1 and the bottom surface of bottom substrate 2 by using a tool or the like. The predetermined temperature is, for example, 140 to 150° C. The heat pressing hardens anisotropic conductive adhesive 11 applied to the bottom surface of top substrate 1, the top surface of bottom substrate 2, or the end of wiring board 8. Hardened anisotropic conductive adhesive 11 allows upper electrodes 5 to be bonded and electrically connected to upper wiring patterns 9, and lower electrodes 6 to be bonded and electrically connected to lower wiring patterns 10. Touch panel 20 connected to wiring board 8 is manufactured in this manner.

In touch panel 20 of the present embodiment, when wiring board 8 is connected to top and bottom substrates 1 and 2 by heat press, thermally color-changing portion 15 provided on the bottom surface of wiring board 8 is heated at the same time. For example, in the case where thermally color-changing portion 15 is made of a composition formed by adding a red dye to acetylsalicylic acid having a melting point of 135° C., thermally color-changing portion 15, which is originally whitish pink, turns into transparent red when heated to 135° C. or higher.

If the heat press is performed below the predetermined temperature, for example, at 130° C. or below, anisotropic conductive adhesive 11 is hardened but thermally color-changing portion 15 remains substantially the same color.

After the connection process by the heat press, touch panel 20 is checked for the resistance value between upper electrodes 5 and upper wiring patterns 9 and between lower electrodes 6 and lower wiring patterns 10, and the adhesion condition using a microscope. This examination determines whether the heat press has been properly performed at the predetermined temperature, by inspecting the degree of coloring of thermally color-changing portion 15.

More specifically, thermally color-changing portion 15 changes in color when the heat press is properly performed at the predetermined temperature, but remains nearly the same color when it is performed below the predetermined temperature. Thus checking by the user with his or her eyes the degree of coloring of thermally color-changing portion 15 allows the user to determine the hardness of anisotropic conductive adhesive 11; the bond strength of wiring board 8; and the stability of the electrical connection between upper/lower electrodes and upper/lower wiring patterns. The inspection of the color change can be carried out automatically by using measuring instruments of the color.

The change in color of thermally color-changing portion 15 is irreversible. Thermally color-changing portion 15 does not change in color below the predetermined temperature, and once it has changed in color at the predetermined temperature or above, the color is kept unchanged. This feature allows the user to perform the aforementioned visual check even after some time has elapsed after the bonding and connection process.

Thermally color-changing portion 15 is provided away from anisotropic conductive adhesive 11 with wiring board disposed therebetween. This arrangement prevents anisotropic conductive adhesive 11 and thermally color-changing portion 15 from being mixed with each other during the heat press or other process. In other words, thermally color-changing portion 15 is prevented from entering anisotropic conductive adhesive 11, thereby preventing a decrease in bond strength.

Touch panel 20 thus structured is attached to the front surface of a liquid crystal display or the like of an electronic device. The other end of upper wiring patterns 9 of wiring board 8 and the other end of lower wiring patterns 10 are connected to an electronic circuit (unillustrated) of the device by a connector or soldering.

Touch panel 20 operates as follows.

The user presses on the top surface of top substrate 1 with a finger, a pen, or the like while watching the display of the liquid crystal display behind touch panel 20. As a result, top substrate 1 is bent downward to bring the pressed portion of upper conductive layer 3 into contact with lower conductive layer 4.

At the same time, the unillustrated electronic circuit supplies a voltage sequentially to upper electrodes 5 and lower electrodes 6 via upper wiring patterns 9 and lower wiring patterns 10. The electronic circuit detects the point of contact from the voltage ratio between upper electrodes 5 and between lower electrodes 6. Thus, the switching of various functions of the device can be performed on touch panel 20.

As described hereinbefore, touch panel 20 of the present embodiment has thermally color-changing portion 15 in the vicinity of where upper electrodes 5 and upper wiring patterns 9 are bonded together or in the vicinity of where lower electrodes 6 and lower wiring patterns 10 are bonded together. In other words, thermally color-changing portion 15 is provided adjacent to connecting portions 22 and 23 between panel portion 21 and wiring board 8. Thermally color-changing portion 15 is preferably heated to approximately the same temperature as connecting portions 22 and 23. The term "to be adjacent to the connecting portions" used in the present invention means not only to be indirect contact with the connecting portions, but also to be located a predetermined distance from the connecting portions. In the predetermined distance, thermally color-changing portion 15 can be heated to approximately the same temperature as connecting portions 22 and 23. The predetermined distance is preferably 5 mm, and more preferably not more than 2 mm from the connecting portions.

Whether the heat press has been properly performed at the predetermined temperature when wiring board 8 is bonded and connected to substrates 1 and 2 can be easily checked from the degree of coloring of thermally color-changing portion 15. This allows touch panel 20 to be manufactured simply and to ensure reliable electrical contact and separation.

Although thermally color-changing portion 15 is provided in the center of the bottom surface of wiring board 8 in the above description, the present invention allows thermally color-changing portion 15 to be provided in other locations.

FIG. 2A shows the case where thermally color-changing portion 15 is inwardly adjacent to connecting portions 22. Alternatively, as shown in FIG. 2B, it is possible to provide thermally color-changing portion 17 outwardly adjacent to connecting portions 22; thermally color-changing portion between connecting portions 22; or color-changing portion 18 adjacent to connecting portions 23. It is also possible to provide a plurality of thermally color-changing portions adjacent to all the connecting portions.

FIG. 2C and FIG. 3 show touch panel 30 of another embodiment of the present invention.

Touch panel 30 includes thermally color-changing portion 19 in the center of the top surface of bottom substrate 2. Thermally color-changing portion 19 can be provided in the region that is heated at the same time as anisotropic conductive adhesive 11 when wiring board 8 is heated. Therefore, thermally color-changing portion 19 is provided adjacent to the connecting portions between panel portion 21 and wiring board 8.

The formation of thermally color-changing portion 19 is not limited to the coating as described above. Another method is as follows: A thermally color-changing sheet piece is prepared by coating paper, film, or the like with a solution. The solution contains a composition formed by adding a dye exhibiting a predetermined color to stearic acid, acetylsalicylic acid, or acetyl acid. Then, the sheet piece is pasted to wiring board 8, top substrate 1, or bottom substrate 2. Further another method is to cut a commercially available thermal tape into an appropriate size and to paste it.

In FIG. 3, thermally color-changing portion 19 is provided in the center of slit 8A of wiring board 8 on the top surface of bottom substrate 2. Alternatively, thermally color-changing portion 19 can be provided on one or both sides of wiring board 8 on the top surface of bottom substrate 2 or on the bottom surface of top substrate 1.

In the above description, wiring board 8 is provided on the top and bottom surfaces thereof with upper wiring patterns 9 and lower wiring patterns 10, respectively; however, the touch panel of the present invention is not limited to this structure. As another example, the wiring board may have a plurality of wiring patterns on one of the top and bottom surfaces. As further another example, the wiring board may have wiring patterns only on one surface at the end that is connected to a connector or the like via a throughhole or the like.

The touch panel of the present invention, which has the advantage of being manufactured simply and ensuring reliable electrical contact and separation, is useful to the operation of various electronic devices.

It will be obvious to those skilled in the art that various changes may be made in the above-described embodiments of the present invention. However, the scope on the present invention should be determined by the following claims.

What is claimed is:

1. A touch panel comprising:
    a panel portion having an extraction electrode;
    a wiring board having a wiring pattern;
    an anisotropic conductive adhesive connecting the wiring pattern and the extraction electrode, wherein the anisotropic conductive adhesive is hardened by having been heated; and
    a thermally color-changing portion, adjacent to a connecting portion where the wiring pattern and the extraction electrode are connected to each other;
    wherein the thermally color-changing portion is formed by: (i) a first material containing a pigment; and (ii) a thermoplastic resin coating the pigment and having a melting point lower than a hardening temperature of the anisotropic conductive adhesive; being heated at the hardening temperature of the anisotropic conductive adhesive or greater such that the thermoplastic resin is melted and the first material is irreversibly changed in color in a manner that the pigment is exposed, or
    the thermally color-changing portion is formed by: (i) a second material containing a compound exhibiting a predetermined color; and (ii) one of stearic acid, acetylsalicylic acid, and acetyl acid mixed with the compound; being heated at the hardening temperature of the anisotropic conductive adhesive or greater such that the one of stearic acid, acetylsalicylic acid, and acetyl acid is melted and the second material is irreversibly changed in color to a color corresponding to the predetermined color of the compound.

2. The touch panel of claim 1, wherein
    the panel portion includes a top substrate having the extraction electrode thereon and a bottom substrate having the extraction electrode thereon; and
    the thermally color-changing portion is provided on a portion of one of the top substrate and the bottom substrate, the portion being sandwiched in a parallel direction to surfaces of the both substrates by the extraction electrode of the top substrate and the extraction electrode of the bottom substrate.

3. The touch panel of claim 1, wherein
    the thermally color-changing portion is provided adjacent to the extraction electrode.

4. The touch panel of claim 3, wherein
    the thermally color-changing portion is provided on the wiring board.

5. The touch panel of claim 1, wherein
    the thermally color-changing portion is provided adjacent to a portion of the wiring pattern, the portion facing the extraction electrode.

6. The touch panel of claim 5, wherein
    the thermally color-changing portion is provided on the wiring board.

7. The touch panel of claim 5, wherein
    the panel portion includes a top substrate having the extraction electrode thereon, and a bottom substrate having the extraction electrode thereon; and
    the thermally color-changing portion is provided on one of the top substrate and the bottom substrate.

* * * * *